(12) United States Patent
Choo et al.

(10) Patent No.: US 6,797,961 B2
(45) Date of Patent: Sep. 28, 2004

(54) X-RAY DETECTOR AND METHOD OF FABRICATING THE SAME

(75) Inventors: Ky-Seop Choo, Gumi-si (KR); June-Ho Park, Gumi-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/217,160

(22) Filed: Aug. 13, 2002

(65) Prior Publication Data

US 2003/0038241 A1 Feb. 27, 2003

(30) Foreign Application Priority Data

Aug. 21, 2001 (KR) ........................................ 2001-50167

(51) Int. Cl.[7] .................................................. G01T 1/24
(52) U.S. Cl. ............................ 250/370.09; 250/370.08; 250/370.11; 250/370.14
(58) Field of Search ....................... 250/370.01, 370.08, 250/370.09, 370.11, 370.14

(56) References Cited

U.S. PATENT DOCUMENTS

| | | | | |
|---|---|---|---|---|
| 5,598,004 A | * | 1/1997 | Powell et al. | 250/370.09 |
| 6,025,599 A | * | 2/2000 | Lee et al. | 250/370.09 |
| 6,423,973 B2 | * | 7/2002 | Choo et al. | 250/370.09 |
| 6,437,341 B1 | * | 8/2002 | Izumi et al. | 250/370.13 |
| 6,507,026 B2 | * | 1/2003 | Ikeda et al. | 250/370.09 |

* cited by examiner

Primary Examiner—Nikita Wells
Assistant Examiner—Christopher M. Kalivoda
(74) Attorney, Agent, or Firm—McKenna Long & Aldridge LLP

(57) ABSTRACT

An X-ray sensing array substrate that includes a storage capacitor having first and second capacitor electrodes and a pixel electrode over the storage capacitor. One of the capacitor electrodes contacts a drain electrode of a thin film transistor through a first contact hole in an insulating layer. The pixel electrode contacts that capacitor electrode through a second contact hole through a second insulting layer. Therefore, the drain electrode is connected to the storage capacitor through only one contact, while the pixel electrode contacts the storage capacitor through only one contact. This reduces the drain electrode to capacitor resistance, reduces the voltage drop, and increases the sensitivity of the array.

37 Claims, 7 Drawing Sheets

X-RAY DETECTOR AND METHOD OF FABRICATING THE SAME

This application claims the benefit of Korean Patent Application No. 2001-50167, which was filed in Korea on Aug. 21, 2001, and which is hereby incorporated by reference for all purposes as if fully set forth herein.

BACKGROUND OF THE INVENTION

1. Field of the Invention

The present invention relates to X-ray detectors. More particularly, it relates to Thin Film Transistor (TFT) array substrates for use in X-ray detectors.

2. Description of Related Art

A widely used aid to medical diagnosis is the X-ray film. As such films produce photographic images, time consuming film-processing procedures are required to obtain the results. However, digital X-ray sensing devices (referred to hereinafter as X-ray detectors) that employ thin film transistors have been developed. Such X-ray sensing devices have the significant advantage of providing real time imaging that speeds diagnosis.

FIG. 1 is a schematic cross-sectional view illustrating the structure and operation of an X-ray detector according to a conventional art. Included are a substrate 1, a thin film transistor 3, a storage capacitor 2, a pixel electrode 4, a photoconductive film 5, a protection film 6, a conductive electrode 7 and a high voltage D.C. (direct current) power supply 8.

The photoconductive film 5 produces electron-hole pairs 9 in proportion to the strength of external signals (such as incident electromagnetic waves). That is, the photoconductive film 5 acts as a converter that converts external signals, particularly X-rays, into electric signals. When an external voltage Va is applied across the conductive electrode 7, the electron-hole pairs 9 separate such that X-ray induced electrical charges accumulate on the pixel electrode 4. Thus, either the electrons or the holes are gathered by the pixel electrode 4 as electric charges. The electric charge species that is gathered depends on the polarity of the high voltage D.C. power supply 8.

As shown in FIG. 1, the pixel electrode 4 is located beneath the photoconductive film 5. The gathered electric charges accumulate in the storage capacitor 2, which connects with a grounding line. Charges in the storage capacitor 2 are selectively transferred through a thin film transistor (TFT) 3 to an external image display device that produces an X-ray image.

FIG. 2 is a schematic plan view illustrating one pixel of an X-ray detector array substrate according to the conventional art, and FIG. 3 is a cross-sectional view taken along line III—III of FIG. 2.

As shown in FIGS. 2 and 3, a gate line 21 is arranged in a transverse direction on a substrate 10. A gate electrode 22 that extends from the gate line 21 is also on the substrate 10. A gate insulation layer 30 is formed over the substrate 10, over the gate line 21, and over the gate electrode 22. An active layer 41, comprised of amorphous silicon, is formed on the gate insulation layer 30 and over the gate electrode 22. Ohmic contact layers 42a and 42b, which are comprised of doped amorphous silicon, are formed on the active layer 41.

A data line 51 is on the gate insulation layer 30. That data line is arranged perpendicular to the gate line 21. A source electrode 52 extends from the data line 51 over the first ohmic contact layer 42a. A drain electrode 53 is on the second ohmic contact layer 42b. The drain electrode 53 is spaced apart from the source electrode 52 such that the source and drain electrodes 52 and 53 face each other across the active layer 41. Therefore, a thin film transistor (TFT) T1 comprised of the gate electrode 22, the active layer 41, the ohmic contact layers 42a and 42b, and the source and drain electrodes 52 and 53 is formed as a switching element near the crossing of the gate and data lines 21 and 51.

Still referring to FIGS. 2 and 3, a common line 55, which is comprised of the same material as the data line 51, is arranged perpendicularly to the gate line 21 so as to cross the pixel region defined by the gate and data lines 21 and 51. The common line 55 grounds the neighboring pixels. A first capacitor electrode 61, made of a transparent conductive material, is formed in the pixel region and on the common line 55. A second capacitor electrode 75, which is also made of a transparent conductive material, is formed over the first capacitor electrode 61. The second capacitor electrode 75 generally corresponds in size and position to the first capacitor electrode 61. A dielectric layer 71 is interposed between the first capacitor electrode 61 and the second capacitor electrode 75, thus forming a storage capacitor C1. A passivation layer 80 is formed on the second capacitor electrode 75 and over the TFT T1 such that the passivation layer 80 protects the storage capacitor C1 and the TFT T1. The passivation layer 80 includes a first contact hole 81, which exposes a portion of the second capacitor electrode 75, and a second contact hole 82, which exposes a portion of the drain electrode 53. As shown in FIG. 3, the second contact hole 82 penetrates both the passivation layer 80 and the dielectric layer 71.

A pixel electrode 91, which is made of a transparent conductive material, is formed on the passivation layer 80 in the pixel region. The pixel electrode 91 extends over the TFT T1. The pixel electrode contacts the second capacitor electrode 75 through the first contact hole 81 and contacts the drain electrode 53 through the second contact hole 82. Although not shown in FIG. 3 (but see FIG. 6I for similar structures), a photoconductive film that generates electric charges is on the pixel electrode 91. The pixel electrode 91 gathers electric charges generated by the photoconductive film and applies them to the storage capacitor C1. Namely, the pixel electrode 91 acts as a current-collecting electrode. As previously mentioned, since the pixel electrode 91 electrically contacts the drain electrode 53 through the second contact hole 82, the holes stored in the storage capacitor C1 combine with the electrons that flow from the TFT T1.

When the X-ray image sensing device produces image signals, the electric charges stored in the storage capacitor C1 flow to TFT T1 by way of the pixel electrode 91, which contacts both the first capacitor electrode 75 an one through the first contact hole 81 and the other through the second contact hole 82, the pixel electrode 91 contact resistance is relatively large. Therefore, weak signals, which produce a small quantity of electric charges, are difficult to detect because it is difficult to distinguish between the actual signals and noise. Thus, the sensitivity of the X-ray detector is less than optimal.

Therefore, an X-ray sensing device array substrate having decreased pixel electrode contact resistance would be beneficial. Also beneficial would be an X-ray detector array having improved detection ability.

SUMMARY OF THE INVENTION

Accordingly, the present invention is directed to an array substrate for an X-ray detector that substantially obviates one or more of the problems due to limitations and disadvantages of the related art.

An advantage of the present invention is a method and an X-ray sensing device array substrate having decreased drain electrode contact resistance.

Another advantage of the present invention is a method and X-ray detector array having improved detection ability.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

In order to accomplish at least one of the above advantages, the principles of the present invention provide for an innovate X-ray detector array substrate. That array substrate includes a substrate; a gate line on the substrate; a gate insulation layer over the substrate and over the gate line; and a data line on the gate insulation layer that crosses the gate line so as to define a pixel region. A thin film transistor is located near the crossing of the gate and data lines. The thin film transistor includes a gate electrode, an active layer, a source electrode, a drain electrode and the gate insulation layer, which covers the gate electrode. A ground line crosses the pixel region. A first capacitor electrode is in the pixel region and on the gate insulation layer. The first capacitor electrode covers and contacts the ground line. A dielectric layer covers the first capacitor electrode and the thin film transistor. A first contact hole through the dielectric layer exposes a portion of the drain electrode. A second capacitor electrode is in the pixel region and on the dielectric layer. The second capacitor electrode corresponds to the first capacitor electrode and extends over the drain electrode so as to contact the drain electrode through the first contact hole. A first passivation layer is on the second capacitor electrode and over the thin film transistor. A second contact hole that exposes a portion of the second capacitor electrode passes through the first passivation layer. A pixel electrode is in the pixel region and on the first passivation layer. The pixel electrode contacts the second capacitor electrode through the second contact hole and extends over both the thin film transistor and the gate line. A photoconductive film covers the pixel electrode. A conductive electrode is on the photoconductive film. The thin film transistor beneficially includes first and ohmic contact layers on the active layer. The array substrate further includes a second passivation layer between the photoconductive film and the conductive electrode. The gate line and the gate electrode are beneficially comprised of aluminum (Al) or an aluminum alloy. The gate insulation layer and the dielectric layer include are beneficially comprised of an inorganic substance. The first and second capacitor electrodes and the pixel electrode beneficially include a transparent conductive material, such as indium tin oxide or indium zinc oxide. The first passivation layer beneficially includes benzocyclobutene (BCB).

To achieve the above advantages, the principles of the present invention further provide for a method of fabricating an array substrate for use in an X-ray sensing device. The method includes providing a substrate, forming a gate line on the substrate; forming a gate insulation layer on the substrate and over the gate line, and forming a data line on the gate insulation layer that crosses the gate line, thereby defining a pixel region. The method further includes forming a thin film transistor near the crossing of the gate and data lines, with the thin film transistor including a gate electrode, an active layer, a source electrode, a drain electrode and a gate insulation layer, wherein the gate electrode is covered by the gate insulation layer. The method further includes forming a ground line that crosses the pixel region, forming a first capacitor electrode on the gate insulation layer in the pixel region such that the first capacitor electrode covers and contacts the ground line; and forming a dielectric layer on the first capacitor electrode, with the dielectric layer covering the first capacitor electrode and the thin film transistor, and having a first contact hole that exposes a portion of the drain electrode of the thin film transistor. Then, forming a second capacitor electrode in the pixel region and on the dielectric layer, with the second capacitor electrode corresponding to the first capacitor electrode and extending over the drain electrode so as to contact the drain electrode through the first contact hole. Then, forming a first passivation layer on the second capacitor electrode and over the thin film transistor, with the first passivation layer having a second contact hole that exposes a portion of the second capacitor electrode, and forming a pixel electrode on the first passivation layer in the pixel region, with the pixel electrode contacting the second capacitor electrode through the second contact hole and extending over the thin film transistor and over the gate line. Then, forming a photoconductive film on the pixel electrode such that the photoconductive film covers the pixel electrode. Then, forming a conductive electrode on the photoconductive film. The method further includes locating a second passivation layer between the photoconductive film and the conductive electrode.

In order to accomplish the above advantages, in another aspect, the principles of the present invention provide for a method of fabricating an array substrate for use in an X-ray sensing device. That method includes forming a gate line and a gate electrode on a substrate; forming a gate insulation layer on the substrate so as to cover the gate line and the gate electrode; forming an active layer on the gate insulation layer and over the gate electrode; forming first and second ohmic contact layers on the active layer; forming a data line, a source electrode, a drain electrode and a ground line, thereby defining a thin film transistor, wherein the data line is on the gate insulation layer and perpendicularly crosses the gate to define a pixel region, wherein the source electrode extends from the data line over the first ohmic contact layer, wherein the drain electrode is spaced apart from the source electrode and is on the second ohmic contact layer, and wherein the ground line crosses the pixel region; forming a first capacitor electrode on the gate insulation layer in the pixel region so as to cover and contact the ground line; forming a dielectric layer on the first capacitor electrode and on the thin film transistor, wherein the dielectric layer has a first contact hole that exposes a portion of the drain electrode, forming a second capacitor electrode on the dielectric layer in the pixel region, wherein the second capacitor electrode overlaps and contacts a portion of the drain electrode through the first contact hole; forming a first passivation layer on the second capacitor electrode and on the dielectric layer over the thin film transistor, wherein the first passivation layer has a second contact hole that exposes a portion of the second capacitor electrode; forming a pixel electrode on the first passivation layer in the pixel region, wherein the pixel electrode contacts the second capacitor electrode through the second contact hole; forming a photoconductive film on the pixel electrode; and forming a conductive electrode over the photoconductive film. The method further includes forming a second passivation layer between the photoconductive film and the conductive electrode. The first passivation layer is beneficially comprised of an organic substance, such as benzocyclobutene (BCB). The pixel electrode beneficially extends over the thin film transistor and over the gate line. The pixel electrode and the first and second capacitor electrode are beneficially comprised of a transparent conductive material such as indium tin oxide and/or indium zinc oxide.

To accomplish at least one of the above advantages, in another aspect, the principles of the present invention provide for an X-ray detector array substrate. That array substrate includes a gate line and a gate electrode on a substrate. A gate insulation layer covers the substrate, the gate line, and the gate electrode. An active layer is on the gate insulation layer and over the gate electrode. First and second ohmic contact layers are formed on the active layer. A data line is on the gate insulation layer and crosses the gate line. The data line and the gate define a pixel region. Source and drain electrodes are on the first and second ohmic contact layer, respectively, wherein the source electrode extends from the data line and contacts the first ohmic contact layer, and wherein the drain electrode is spaced apart from the source electrode and is on the second ohmic contact layer, thereby defining a thin film transistor. A ground line crosses the pixel region. A first capacitor electrode is on the gate insulation layer. The first capacitor electrode both covers and contacts the ground line. A dielectric layer is over both the first capacitor electrode and the thin film transistor, wherein the dielectric layer has a first contact hole that exposes a portion of the drain electrode. A second capacitor electrode is on the dielectric layer, wherein the second capacitor electrode overlaps and contacts a portion of the drain electrode through the first contact hole. A first passivation layer is on the second capacitor electrode and on the dielectric layer over the thin film transistor, wherein the first passivation layer has a second contact hole that exposes a portion of the second capacitor electrode. A pixel electrode is on the first passivation layer so as to contact the second capacitor electrode through the second contact hole. A photoconductive film is on the pixel electrode, and a conductive electrode is over the photoconductive film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, examples of which are shown in the accompanying drawings. Wherever possible, the similar reference numbers will be used throughout the drawings to refer to the same or the parts.

Figure 4:
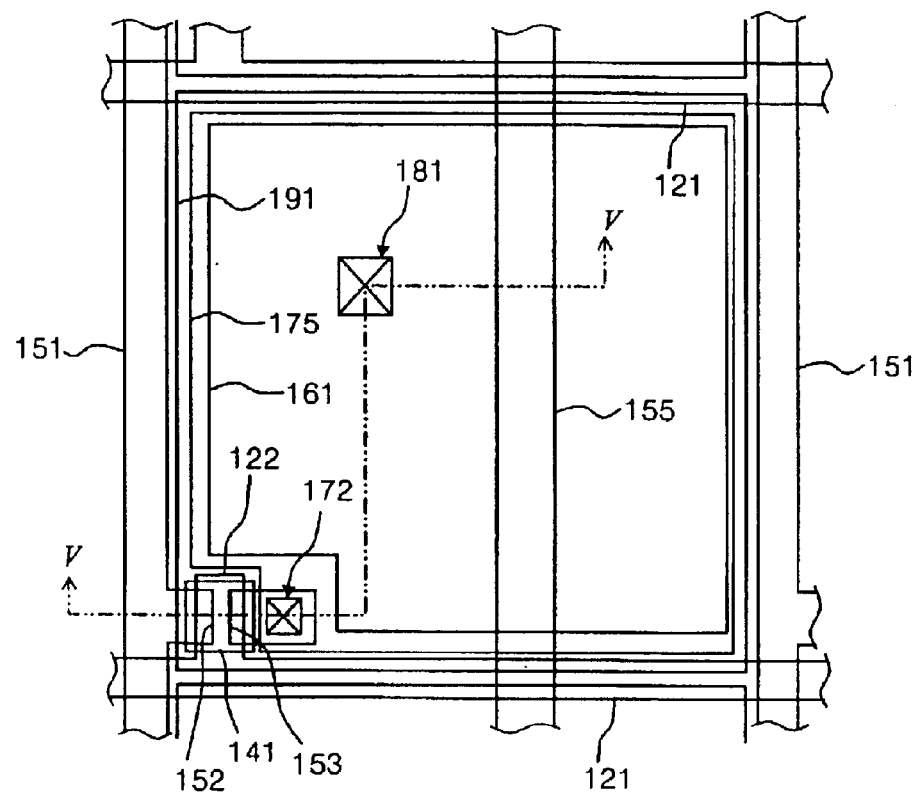
FIG. 4 is a partial schematic plan view of an X-ray detector array substrate that is in accord with the principles of the present invention.
Figure 5:
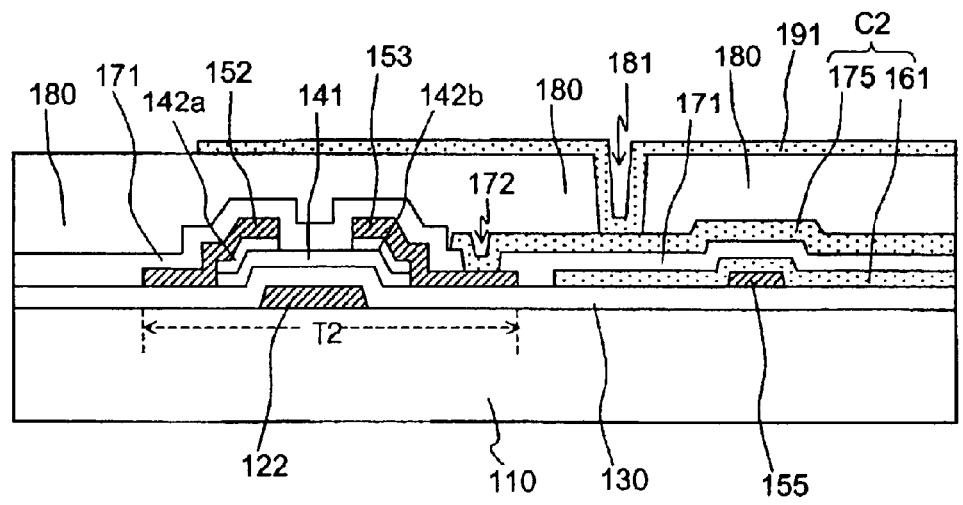
FIG. 5 is a cross-sectional view taken line V—V of FIG. 4.

FIG. 4 is a partial schematic plan view of an X-ray detector array substrate that is in accord with the principles of the present invention, and FIG. 5 is a cross-sectional view taken line V—V of FIG. 4. In FIG. 5, a photoconductive film and a conductive film are omitted for clarity.

As shown in FIGS. 4 and 5, a gate line 121, comprised of a low electrical resistant material, is arranged in a transverse direction on a substrate 110. A gate electrode 122 extends from the gate line 121. A gate insulation layer 130, made of silicon nitride or silicon oxide, is formed over the substrate 110, over the gate line 121, and over the gate electrode 122.

An active layer 141 of amorphous silicon is formed on the gate insulation layer 130 over the gate electrode 122. Ohmic contact layers 142a and 142b, made of doped amorphous silicon, are formed on the active layer 141.

A data line 151 is formed on the gate insulation layer 130 in a direction that is perpendicular to the gate line 121. The gate line 121 and the data line 151 define a pixel region. A source electrode 152 extends from the data line 151 over the first ohmic contact layer 142a. A drain electrode 153 is on the second ohmic contact layer 142b and is spaced apart from source electrode 152. The source and drain electrodes 152 and 153 face each other across the active layer 141. A thin film transistor (TFT) T2 is formed by the gate electrode 122, the active layer 141, the ohmic contact layers 142a and 142b, and by the source and drain electrodes 152 and 153. The thin film transistor (TFT) T2, which is near the crossing of the gate and data lines 121 and 151, acts as a switching element. The data line 151 and the source and drain electrodes 152 and 153 are made of the conductive material, such as a metal.

A common line 155, made of the same material as the data line 151, is arranged perpendicular to the gate line 121 and crosses the pixel region. The common line 155 acts as an earth line to ground the neighboring pixels.

A first capacitor electrode 161, made of a transparent conductive material such as indium-tin-oxide (ITO), covers and is in contact with the common line 155. A dielectric layer 171 is formed over the first capacitor electrode 161 and over the TFT T2. The dielectric layer 171 is beneficially an inorganic material, such as silicon nitride or silicon oxide. The dielectric layer 171 has a first contact hole 172 that exposes a portion of the drain electrode 153.

A second capacitor electrode 175, which is also made of the transparent conductive material, e.g., ITO, is formed on the dielectric layer 171 and over the first capacitor electrode 161. The second capacitor electrode 175 overlaps the first capacitor electrode 161 and extends over and contacts a portion of the drain electrode 153 through the first contact hole 172. The second capacitor electrode 175, the first capacitor electrode 161, and the dielectric layer 171 form a storage capacitor C2.

A first passivation layer 180, made of an organic material such as benzocyclobutene (BCB), is formed on the second capacitor electrode 175 and over the TFT T2. The first passivation layer 180 protects the storage capacitor C2 and the TFT T2. The first passivation layer 180 includes a second contact hole 181 that exposes a portion of the second capacitor electrode 175. As shown in FIG. 5, the first contact hole 172 penetrates only the dielectric layer 171 to the drain electrode 153, and the second contact hole 181 penetrates only the first passivation layer 180 to the second capacitor electrode 175.

Figure 1:
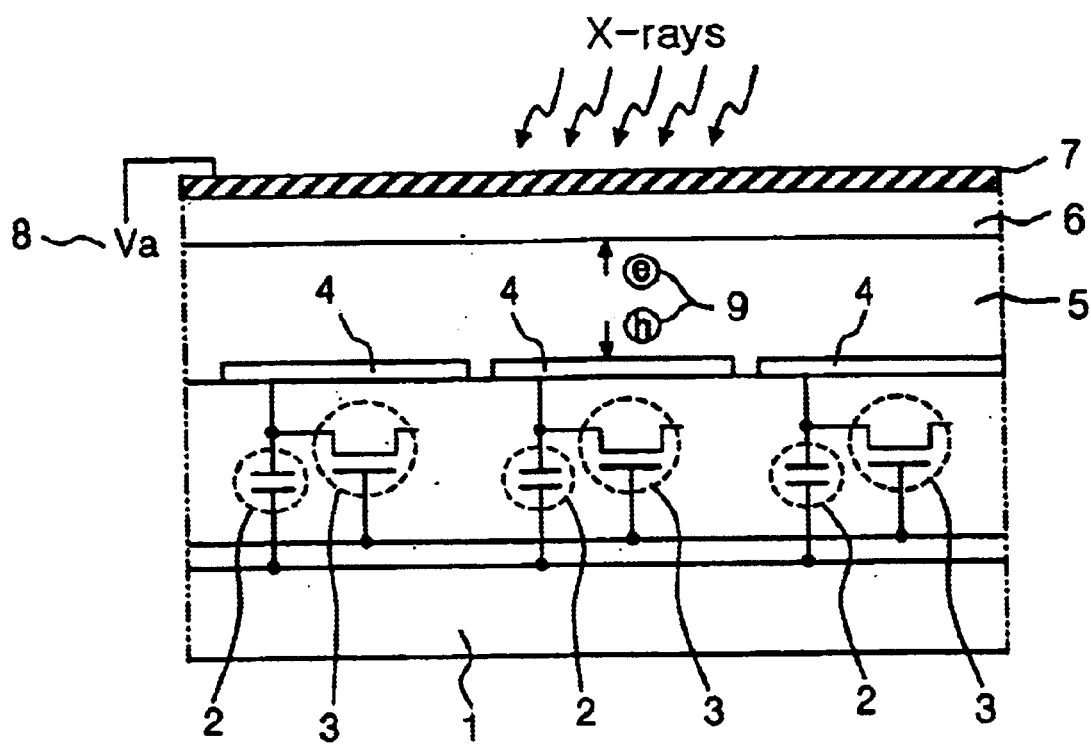
FIG. 1 is a schematic cross-sectional view illustrating the structure and operation of an X-ray detector according to a conventional art.
Figure 2:
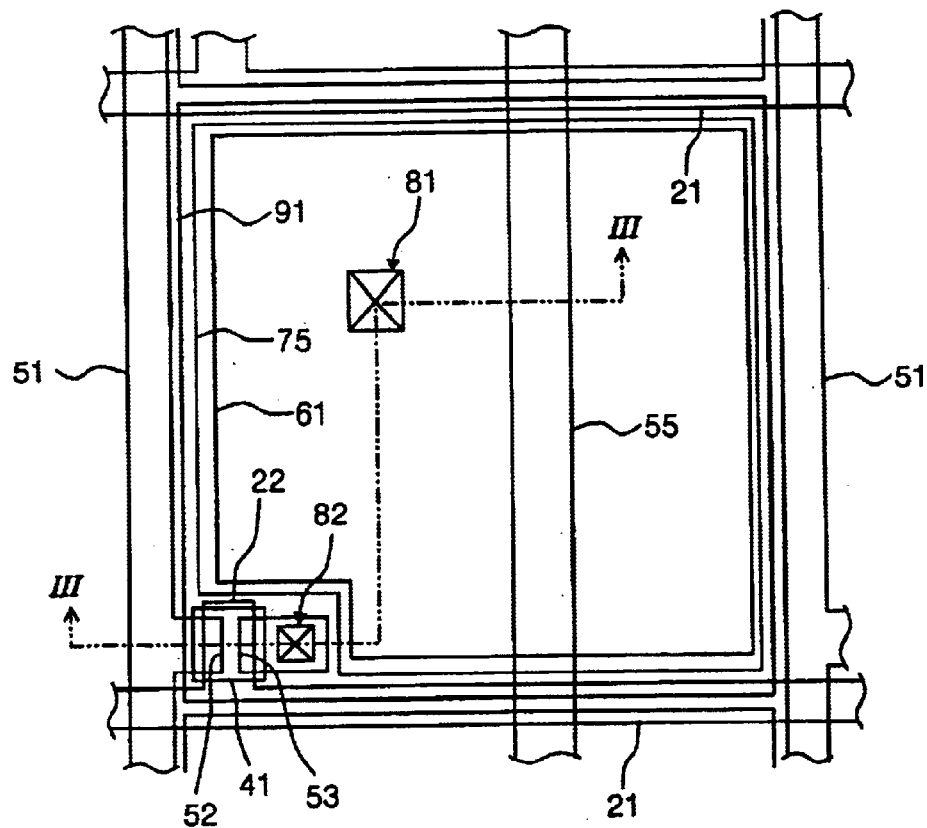
FIG. 2 is a schematic plan view illustrating one pixel of an X-ray detector array substrate according to the conventional art.
Figure 3:
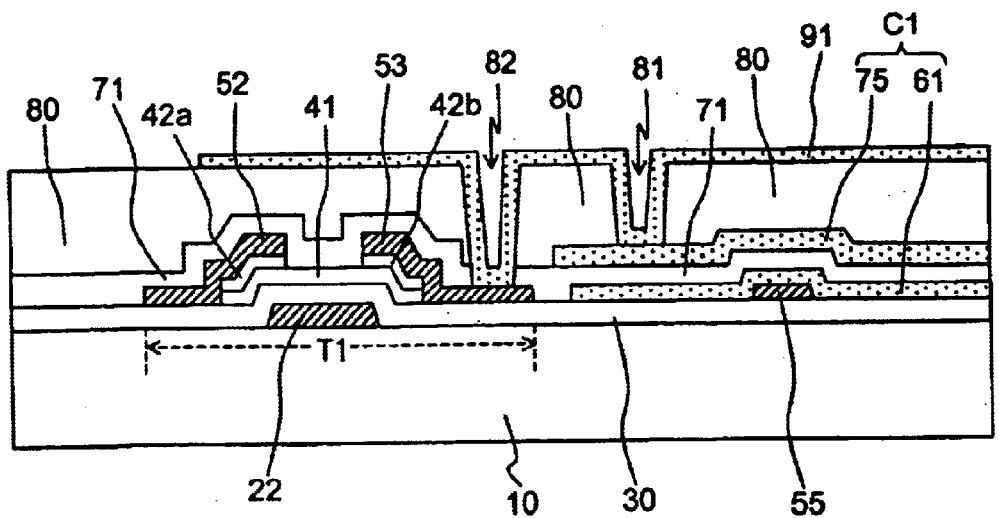
FIG. 3 is a cross-sectional view taken along line III—III of FIG. 2.

A pixel electrode 191, which is made of a transparent conductive material such as ITO, is formed in the pixel region on the first passivation layer 180. The pixel electrode 191 extends over the TFT T2 and over a portion of the gate electrode 122. The pixel electrode 191 contacts the second capacitor electrode 175 through the second contact hole 181. Although not shown in FIGS. 4 and 5, a photoconductive film (but reference 210 of FIG. 6I) is located on the pixel electrode 191. The photoconductive film generates electric charges, for example, holes, that are gathered by the pixel electrode 191 and collected in the storage capacitor C2. Thus, the pixel electrode 191 acts as a charge-collecting electrode. Furthermore, since the pixel electrode 191 overlaps a portion of the gate electrode 122, the pixel electrode 191 can collect relatively more electric charges than in the embodiment illustrated in FIG. 1. Thus, the collection ability of the pixel electrode 191 is improved by extending it over the gate line 121.

In the present invention, since the second capacitor electrode 175 directly contacts the drain electrode 153 through the first contact hole 172, the electric charges collected by the pixel electrode 191 directly flow from the second capacitor electrode 175 to the TFT T2. Therefore, electric charges stored in the storage capacitor C2 pass from the second capacitor electrode 175 to the drain electrode 153 through just one electrical contact, which is in direct contrast to the two electrical contacts required in the conventional art. As a result, the contact resistance between the storage capacitor C2 and the TFT T2 is reduced, which reduces the voltage drop between the storage capacitor C2 and the TFT T2, which improves the detection ability (sensitivity) of the X-ray detector.

The fabrication of the array substrate illustrated in FIGS. 4 and 5 will be explained with reference to FIGS. 6A to 6I, which show cross-sectional views along line V—V of FIG. 4. FIGS. 6A to 6I help illustrate the manufacturing process of producing the array substrate shown in FIGS. 4 and 5.

Figure 6A:
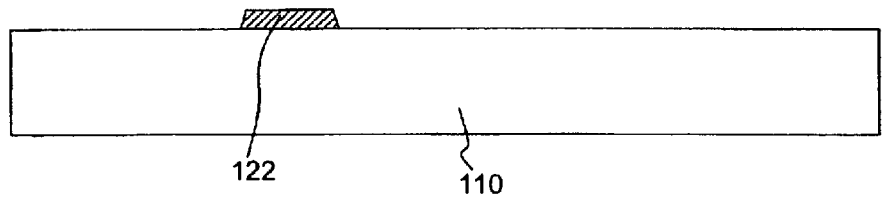
FIGS. 6A to 6I are cross-sectional views that help illustrate manufacturing an X-ray detector array substrate according to the principles of the present invention.

Referring now to FIG. 6A, a first metal layer having a low electrical resistance is formed on the substrate 110 and patterned to form a gate electrode 122. At the time, a gate line 121 (see FIG. 4) is also formed on the substrate 110 in a tranverse direction. The first metal layer is beneficially made of aluminum or of an aluminum alloy. The substrate 110 can be quartz, which has a high melting point, or a glass, which has a relatively low melting point. Since glass is cheaper than quartz, glass is more suitable for substrates used in low temperature processes.

Figure 6B:
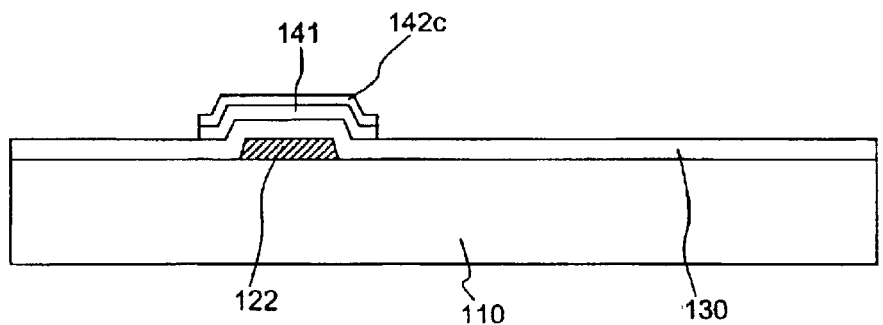

Referring now to FIG. 6B, a gate insulation layer 130 is formed on the substrate 110 and over the patterned metal layer, i.e., the gate electrode 122 and the gate line 121 (see FIG. 4). The gate insulation layer 130 is beneficially an inorganic substance such as silicon nitride or silicon oxide. Thereafter, a pure amorphous silicon (a-Si:H) layer and a doped amorphous silicon (n+ a-Si:H) layer are sequentially formed on the gate insulation layer 130. Those amorphous silicon layers are patterned to form an intrinsic semiconductor layer 141 and an extrinsic semiconductor layer 142c over the gate electrode 122. The intrinsic semiconductor layer 141 will serve as in a thin film transistor.

Figure 6C:
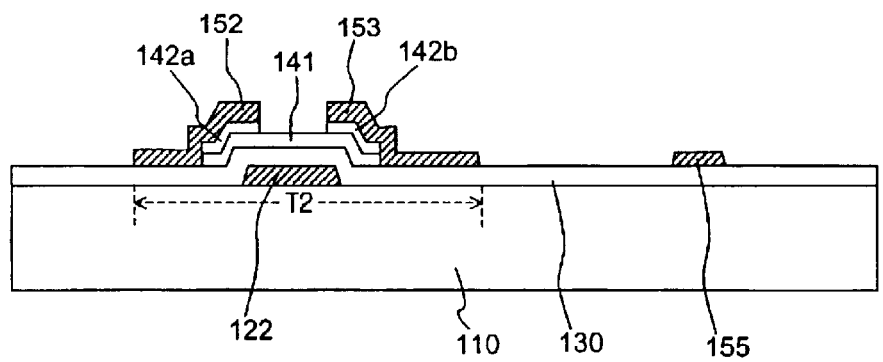

As illustrated by FIG. 6C, a second metal layer is deposited on the gate insulation layer 130 so as to cover the semiconductor layers 141 and 142c. The second metal layer is then patterned to form a source electrode 152, a drain electrode 153, and a ground line 155. At this time, a data line 151 (see FIG. 4) is simultaneously formed perpendicular to the gate line 121. The data line 151 and the gate line 121 define a pixel region (reference FIG. 4).

Thereafter, a portion of the extrinsic semiconductor layer between the source and drain electrodes 152 and 153 is etched, thereby forming first and second ohmic contact layers 142a and 142b. Thus, a TFT T2 is completed. The source electrode 152 is formed on the first ohmic contact layer 142a and over the gate electrode 122. The source electrode is an extension of the data line 151. The drain electrode 153 is formed on the second ohmic contact layer 142b, over the gate electrode 122, and spaced apart from the source electrode 152. As shown in FIG. 4, the ground line 155 runs parallel with the data line 151 and crosses the pixel region defined by the gate line 121 and by the data line 151.

Figure 6D:
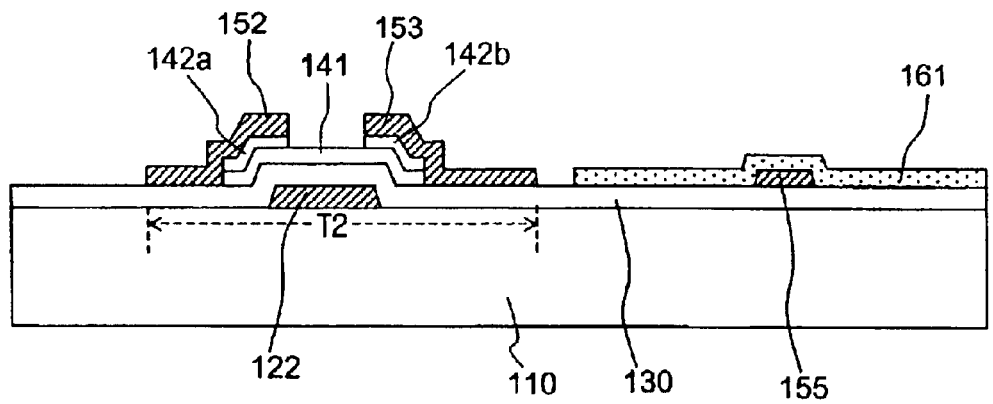

Referring now to FIG. 6D, a transparent conductive material, such as indium tin oxide (ITO) or indium zinc oxide (IZO), is deposited over the whole surface of the substrate 110. That material is then patterned to form a first capacitor electrode 161. As shown in FIGS. 4 and 6D, the first capacitor electrode 161 is formed in the pixel region and in contact with the underlay ground line 155.

Figure 6E:
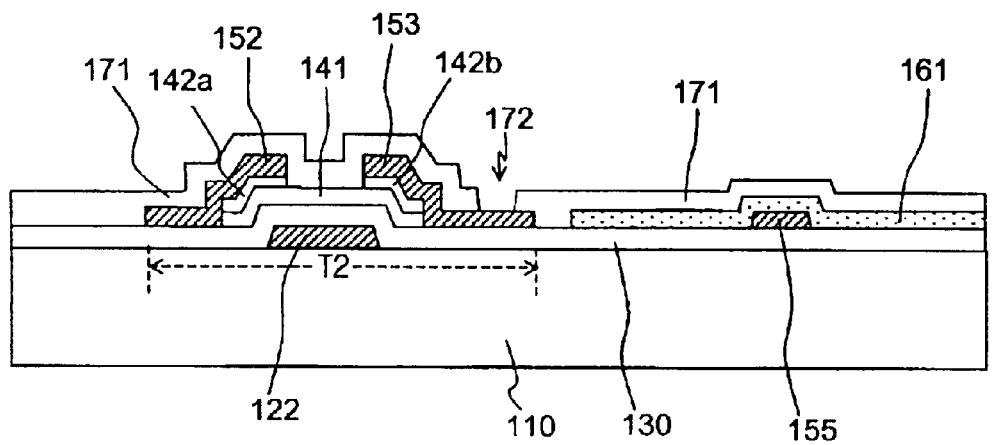

Now referring to FIG. 6E, a dielectric layer 171 is formed over the first capacitor electrode 161 and over the TFT T2 by depositing a silicon insulator (e.g., silicon nitride ($SiN_x$) or silicon oxide ($SiN_2$)). The dielectric layer 171 protects the TFT T2. Thereafter, the dielectric layer 171 is patterned to form a first contact hole 172 that exposes the drain electrode 153.

Figure 6F:
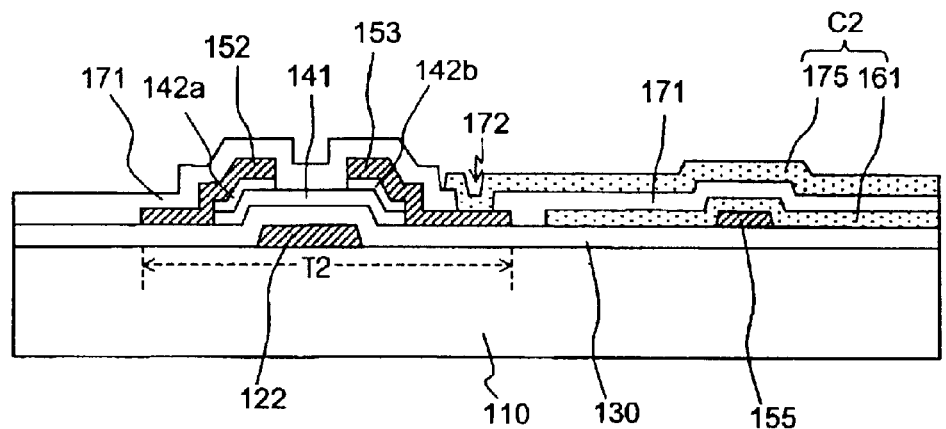

Next, referencing FIG. 6F, a transparent conductive material, such as indium tin oxide (ITO) or indium zinc oxide (IZO), is deposited on the dielectric layer 171 and patterned to form a second capacitor electrode 175. The second capacitor electrode 175 overlaps the first capacitor electrode 161 and extends over a portion of the drain electrode 153. The second capacitor electrode 175, the first capacitor electrode 161, and the dielectric layer 171 form a storage capacitor C2.

Figure 6G:
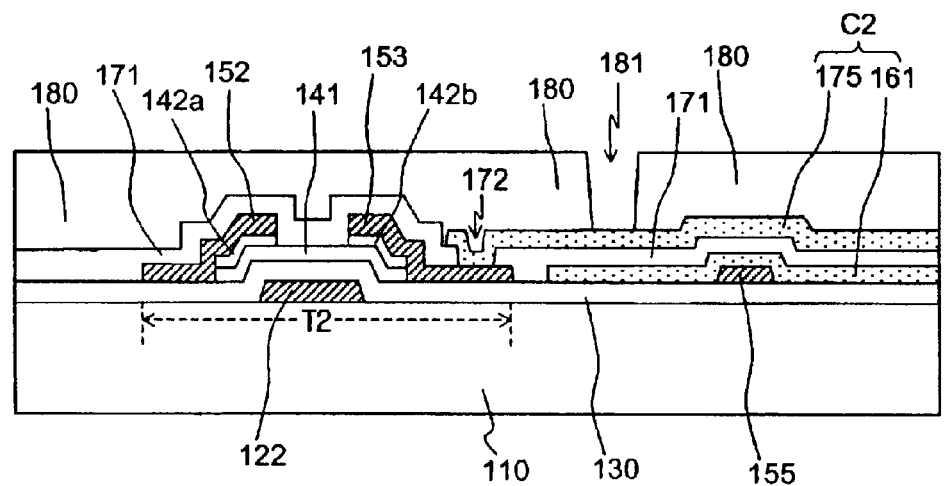

As illustrated by FIG. 6G, a first passivation layer 180 is formed over the exposed dielectric layer 171, and thus over the second capacitor electrode 175. The first passivation layer is beneficially an organic material, such as benzocyclobutene (BCB), which has a low dielectric constant. The first passivation layer 180 not only protects the second capacitor electrode 175, but also planarizes the surface of the substrate to provide a smooth surface. Thereafter, a second contact hole 181 is formed through the first passivation layer 180 by patterning. The second contact hole 181 exposes a portion of the second capacitor electrode 175.

Figure 6H:
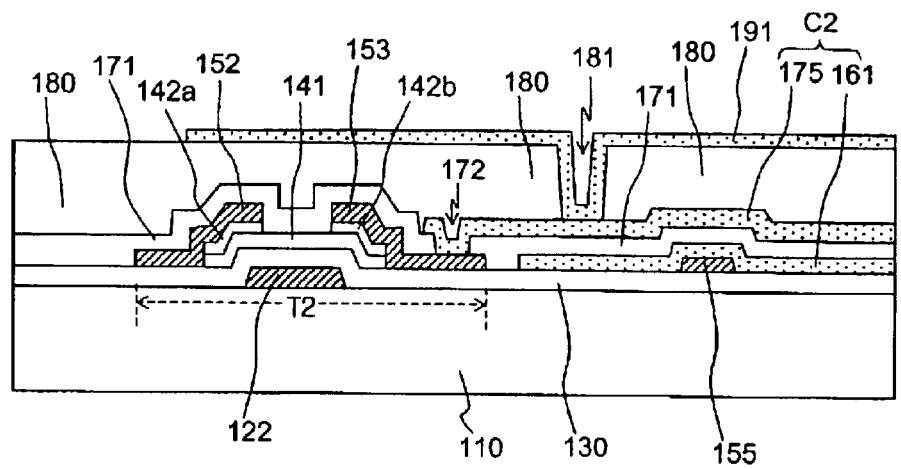

Next as shown by FIG. 6H, a transparent conductive material, such as ITO or IZO, is deposited on the first passivation layer 180 and patterned, thereby forming a pixel electrode 191. The pixel electrode 191 extends over the TFT T2 and second capacitor electrode 175, and contacts the second capacitor electrode 175 through the second contact hole 181. Although not shown in FIG. 6H but shown in FIG. 4, the pixel electrode 191 also overlaps potions of the gate line 121, thus increasing in size.

Figure 6I:
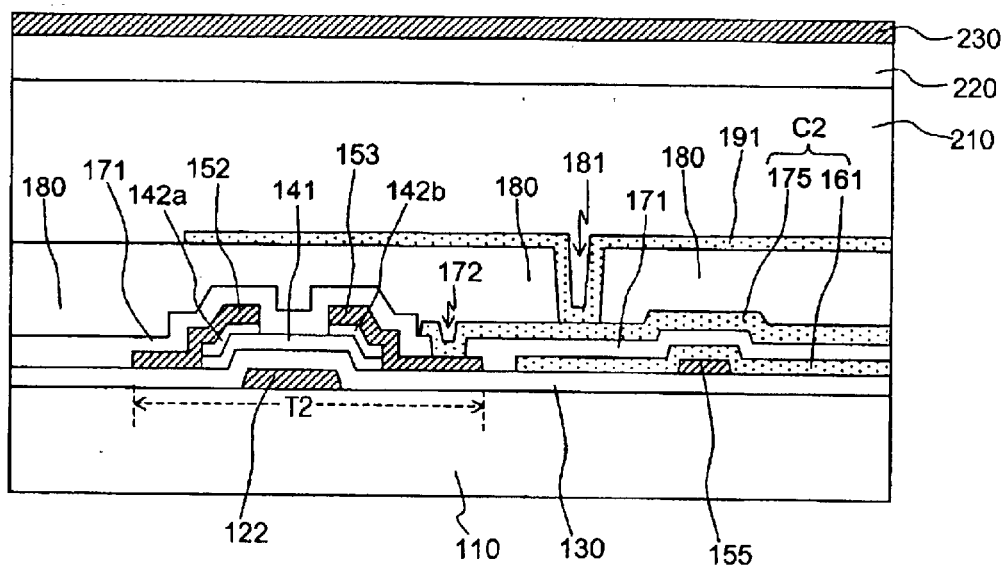

Referring now to FIG. 6I, a photoconductive film 210 is formed on the pixel electrode 191. The photoconductive film 210 can be selenium (Se) or other radiant energy sensitive material. Thereafter, a second passivation layer 220 and a conductive electrode 230 are sequentially formed on the photoconductive film 210.

According to the principles of the present invention an X-ray detector array includes a storage capacitor where one of the capacitor electrodes directly contacts a TFT. Thus, after X-ray signals are detected, the resulting electric charges flow smoothly from the storage capacitor to the TFT because of a reduced contact resistance and a reduced voltage drop. This increases the sensitivity of the X-ray detector.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An X-ray detector array substrate, comprising:
   a substrate;
   a gate line on said substrate, said gate line having an extending gate electrode;
   a gate insulation layer over said substrate, said gate line, and said gate electrode;
   a data line on said gate insulation layer, said data line crossing said gate line to define a pixel region;
   a thin film transistor near said crossing of said gate and data lines, said thin film transistor including said gate electrode, an active layer, a source electrode, a drain electrode and a portion of said gate insulation layer;
   a ground line crossing said pixel region;
   a first capacitor electrode on said gate insulation layer in said pixel region, said first capacitor electrode covering and contacting said ground line;
   a dielectric layer over said first capacitor electrode and said thin film transistor, said dielectric layer having a first contact hole that exposes a portion of said drain electrode;
   a second capacitor electrode over said first capacitor electrode and over said portion of said drain electrode, said second capacitor electrode contacting said drain electrode through said first contact hole;
   a first passivation layer over said second capacitor electrode and over said thin film transistor, said first passivation layer having a second contact hole that exposes a portion of said second capacitor electrode; and
   a pixel electrode on said first passivation layer, said pixel electrode contacting said second capacitor electrode through said second contact hole.

2. The array substrate according to claim 1, wherein said pixel electrode extends over said thin film transistor and over said gate line.

3. The array substrate according to claim 1, further including a photoconductive film over said pixel electrode.

4. The array substrate according to claim 3, further including a conductive electrode over said photoconductive film.

5. The array substrate according to claim 1, wherein said thin film transistor further comprises first and second ohmic contact layers on said active layer.

6. The array substrate according to claim 5, wherein said source electrode is on said first ohmic contact layer, and wherein said drain electrode is on said second ohmic contact layer.

7. The array substrate according to claim 3, further comprising a second passivation layer between said photoconductive film and said conductive electrode.

8. The array substrate according to claim 1, wherein said gate line and said gate electrode are formed of a material selected from a group consisting of aluminum (Al) and an aluminum alloy.

9. The array substrate according to claim 1, wherein said gate insulation layer and said dielectric layer include an inorganic substance.

10. The array substrate according to claim 1, wherein said first and second capacitor electrodes and said pixel electrode include a transparent conductive material.

11. The array substrate according to claim 10, wherein said transparent conductive material is selected from a group consisting of indium tin oxide and indium zinc oxide.

12. The array substrate according to claim 1, wherein said first passivation layer includes benzocyclobutene (BCB).

13. A method of fabricating an X-ray detector array substrate, comprising:
   forming a gate line on a substrate;
   forming a gate insulation layer over the substrate and over the gate line;
   forming a data line on the gate insulation layer and that crosses the gate line so as to define a pixel region;
   forming a thin film transistor near the crossing of the gate and data lines, the thin film transistor including a gate electrode, an active layer, a source electrode, a drain electrode and the gate insulation layer, wherein the gate electrode is covered by the gate insulation layer;
   forming a ground line that crosses the pixel region;
   forming a first capacitor electrode on the gate insulation layer and in the pixel region such that the first capacitor electrode covers and contacts the ground line;
   forming a dielectric layer that covers the first capacitor electrode and the thin film transistor, wherein the dielectric layer includes a first contact hole that exposes a portion of the drain electrode;
   forming a second capacitor electrode over the dielectric layer and over the first capacitor electrode and over a portion of the drain electrode, wherein the second capacitor electrode is formed so as to contact the drain electrode through the first contact hole;
   forming a first passivation layer on the second capacitor electrode and over the thin film transistor, wherein the first passivation layer includes a second contact hole that exposes a portion of the second capacitor electrode; and
   forming a pixel electrode on the first passivation layer, wherein the pixel electrode contacts the second capacitor electrode through the second contact hole, and wherein the pixel electrode extends over at least part of the thin film transistor and over at least part of the gate line.

14. The method according to claim 13, further including the step of forming a photoconductive film on the pixel electrode such that the photoconductive film covers the pixel electrode.

15. The method according to claim 14, further including the step of forming a conductive electrode on the photoconductive film.

16. The method according to claim 15, further comprising locating a second passivation layer between the photoconductive film and the conductive electrode.

17. The method according to claim 13, wherein the thin film transistor is formed with first and second ohmic contact layers on the active layer.

18. The method according to claim 17, wherein the source electrode is on the first ohmic contact layer, and wherein the drain electrode is on the second ohmic contact layer.

19. The method according to claim 13, wherein the gate line and the gate electrode are formed of a material selected from a group consisting of aluminum (Al) and aluminum alloy.

20. The method according to claim 13, wherein the gate insulation layer and the dielectric layer are formed from an inorganic substance.

21. The method according to claim 13, wherein the first and second capacitor electrodes and the pixel electrode are formed from a transparent conductive material.

22. The method according to claim 21, wherein the transparent conductive material is selected from indium tin oxide and indium zinc oxide.

23. The method according to claim 13, wherein the first passivation layer is formed from benzocyclobutene (BCB).

24. A method of fabricating an X-ray detector array substrate, comprising:

forming a gate line and a gate electrode on a substrate;

forming a gate insulation layer on the substrate and over the gate line and the gate electrode;

forming an active layer on the gate insulation layer and over the gate electrode;

forming first and second ohmic contact layers on the active layer;

simultaneously forming a data line, a source electrode, a drain electrode and a ground line, wherein the data line is on the gate insulation layer and perpendicularly crosses the gate line to define a pixel region, wherein a thin film transistor that includes the source and drain electrodes is defined, wherein the source electrode extends from the data line and over the first ohmic contact layer, wherein the drain electrode extends over the second ohmic contact layer, and wherein the source and drain electrodes are spaced apart;

forming a first capacitor electrode on the gate insulation layer in the pixel region such that the first capacitor electrode covers and contacts the ground line;

forming a dielectric layer on the first capacitor electrode and on the thin film transistor, wherein the dielectric layer includes a first contact hole that exposes a portion of the drain electrode;

forming a second capacitor electrode on the dielectric layer in the pixel region, wherein the second capacitor electrode overlaps the portion of the drain electrode, and wherein the second capacitor electrode contacts the portion of the drain electrode through the first contact hole;

forming a first passivation layer over the second capacitor electrode and over the thin film transistor, wherein the first passivation layer includes a second contact hole that exposes a portion of the second capacitor electrode; and forming a pixel electrode on the first passivation layer in the pixel region, wherein the pixel electrode contacts the second capacitor electrode through the second contact hole.

25. The method according to claim 24, further including forming a photoconductive film on the pixel electrode.

26. The method according to claim 25, further including forming a conductive electrode over the photoconductive film.

27. The method according to claim 26, further comprising forming a second passivation layer between the photoconductive film and the conductive electrode.

28. The method according to claim 24, wherein the first passivation layer is formed from an organic substance.

29. The method according to claim 28, wherein the organic substance includes benzocyclobutene (BCB).

30. The method according to claim 24, wherein the pixel electrode extends over the thin film transistor and over the gate line.

31. The method according to claim 24, wherein the pixel electrode and the first and second capacitor electrode are formed from a transparent conductive material that is selected from a group consisting of indium tin oxide and indium zinc oxide.

32. An array substrate for X-ray detector, comprising:

a gate line and a gate electrode on a substrate;

a gate insulation layer on the substrate to over the gate line and the gate electrode;

an active layer on the gate insulation layer and over the gate electrode;

first and second ohmic contact layers on the active layer;

a data line on the gate insulation layer that crosses the gate line to define a pixel region;

source and drain electrodes on the first and second ohmic contact layers, respectively, wherein the source electrode extends from the data line and over the first ohmic contact layer, wherein the drain electrode is spaced apart from the source electrode extends over the second ohmic contact layer, and wherein a thin film transistor is formed;

a ground line in the pixel region;

a first capacitor electrode on the gate insulation layer in the pixel region and that covers and contacts the ground line;

a dielectric layer on the first capacitor electrode and on the thin film transistor, wherein the dielectric layer includes a first contact hole that exposes a portion of the drain electrode;

a second capacitor electrode on the dielectric layer in the pixel region, wherein the second capacitor electrode overlaps and contacts the portion of the drain electrode through the first contact hole;

a first passivation layer on the second capacitor electrode, and on the dielectric layer over the thin film transistor, wherein the first passivation layer includes a second contact hole that exposes a portion of the second capacitor electrode;

a pixel electrode on the first passivation layer in the pixel region, wherein the pixel electrode contacts the second capacitor electrode through the second contact hole;

a photoconductive film formed on the pixel electrode; and a conductive electrode formed over the photoconductive film.

33. The array substrate according to claim 32, further comprising a second passivation layer between the photoconductive film and the conductive electrode.

34. The array substrate according to claim 32, wherein the first passivation layer is an organic substance.

35. The array substrate according to claim 34, wherein the organic substance includes benzocyclobutene (BCB).

36. The array substrate according to claim 32, wherein the pixel electrode extends over the thin film transistor and over the gate line.

37. The array substrate according to claim 32, wherein the pixel electrode and the first and second capacitor electrode are formed of a transparent conductive material selected from a group consisting of indium tin oxide and indium zinc oxide.

* * * * *